United States Patent [19]

Tanimoto

[11] Patent Number: 4,904,952
[45] Date of Patent: Feb. 27, 1990

[54] DIFFERENTIAL AMPLIFIER INCORPORATING NEGATIVE RESISTANCE

[75] Inventor: Hiroshi Tanimoto, Kawasaki, Japan

[73] Assignee: Kabushiki Kaisha Toshiba, Kawasaki, Japan

[21] Appl. No.: 254,242

[22] Filed: Oct. 6, 1988

[30] Foreign Application Priority Data

Oct. 12, 1987 [JP] Japan .................. 62-254785

[51] Int. Cl.⁴ .................. H03F 3/45; H03F 1/42
[52] U.S. Cl. .................. 330/252; 330/261; 333/217
[58] Field of Search .......... 330/252, 253, 258, 259, 330/261, 300; 333/213, 217

[56] References Cited

U.S. PATENT DOCUMENTS 4,468,628  8/1984  Gross .................. 330/258
4,468,629  8/1984  Chana, Jr. .................. 333/217 X Primary Examiner—Steven Mottola
Attorney, Agent, or Firm—Foley & Lardner, Schwartz, Jeffery, Schwaab, Mack, Blumenthal & Evans

[57] ABSTRACT

A differential amplifier capable of achieving a large amplification, a wide frequency range, a high common mode rejection ratio, and a wide dynamic range simultaneously includes a device to produce negative resistance connected to output terminals. The differential amplifier also includes level shift circuits to generate additional voltages.

27 Claims, 12 Drawing Sheets

FIG.10
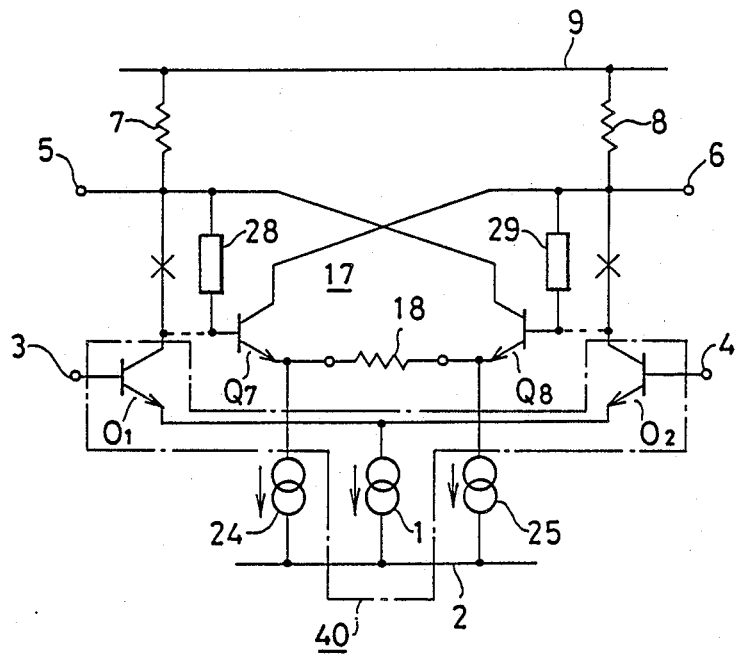
FIG.11A  FIG.11C  FIG.11E
 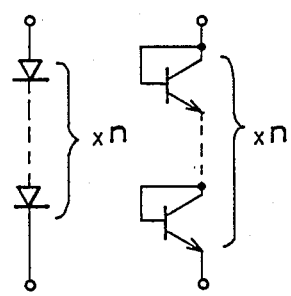 
 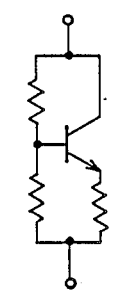
FIG.11B  FIG.11D

DIFFERENTIAL AMPLIFIER INCORPORATING NEGATIVE RESISTANCE

BACKGROUND OF THE INVENTION

1. Field of the Invention

The present invention relates to a differential amplifier and, more particularly, to a differential amplifier including only one type of active element which is especially useful in forming integrated circuits for an active filter.

2. Description of the Prior Art

A differential amplifier has frequently been utilized in forming an analog integrated circuit such as an operational amplifier. Under such circumstances, it is considered desirable for a differential amplifier to possess a greater amplification and a wider frequency range.

One prior art differential amplifier is shown in FIG. 1, which is the most basic differential amplifier with load resistors. This differential amplifier is comprised of a transistor pair formed by npn-type transistors $Q_1$ and $Q_2$ with their emitters connected with each other, a constant current source 1 connected to the emitters of the transistors $Q_1$ and $Q_2$, a negative power supply 2 connected to the constant current source 1, input terminals 3 and 4 connected to bases of the transistors $Q_1$ and $Q_2$, respectively, output terminals 5 and 6 connected to collectors of the transistors $Q_1$ and $Q_2$, respectively, load resistors 7 and 8 also connected to the collectors of the transistors $Q_1$ and $Q_2$, respectively, and a positive power supply 9 connected to the other ends of the load resistors 7 and 8. A portion 40 containing all of the above except the load resistors 7 and 8, input terminals 3 and 4, and the output terminals 5 and 6 will be referred to in the following as a differential amplification portion. This differential amplifier possesses a wide frequency range but a limited amplification due to the fact that resistors are used as loading elements.

Another prior art differential amplifier with improved amplification is shown in FIG. 2, which has been widely used. In this differential amplifier, the loading elements are comprised of a current mirror circuit as an active loading element formed by two pnp-type transistors $Q_3$ and $Q_4$ whose bases are connected with each other and whose collectors are connected to the collectors of the transistors $Q_1$ and $Q_2$, respectively, with a bypass between the collector of the transistor $Q_1$ and the base of the transistor $Q_3$ provided while the rest remains identical to that of FIG. 1 except that the output terminal 5 is not present. This differential amplifier possesses, contrary to the previous one, a very large amplification but a narrower frequency range due to the effect of the current mirror circuit. This is a consequence of the fact that a pnp-type transistor manufactured by a common integrated circuit manufacturing process possesses extremely inferior frequency characteristics compared with an npn-type transistor, so that the inclusion of pnp-type transistors deteriorates the frequency range of the amplifier considerably. Namely, signals entering at the input terminal 3 go through the pnp-type transistors $Q_3$ as well as $Q_4$ while signals entering at the input terminal 4 go through only the npn-type transistor $Q_2$, and yet signals coming out at the output terminal 6 are these signals through the different paths combined so that the inferior frequency characteristics of the pnp-type transistors $Q_3$ and $Q_4$ make the frequency range of the amplifier narrower.

The above argument suggests the way of enhancing the frequency range sustaining the large amplification by avoiding the passage through the pnp-type transistors. A prior art differential amplifier which achieves this is shown in FIG. 3, where it has a constant current load formed by two pnp-type transistors $Q_5$ and $Q_6$ whose bases are connected with each other and whose collectors are connected to the collectors of the npn-type transistors $Q_1$ and $Q_2$, respectively, and a terminal 11 for supplying bias voltages to the transistors $Q_5$ and $Q_6$, while the rest remains identical to that of FIG. 1. With this configuration it is possible to obtain both a large amplification and a wide frequency range.

However, when the input terminals 3 and 4 are at the same voltage, unless the collector currents of the transistors $Q_1$ and $Q_2$ determined by the constant current source 1 and the collector currents of the transistors $Q_5$ and $Q_6$ determined by the bias voltage from the terminal 11 are precisely equal constantly and, the voltages of the output terminals 5 and 6 cannot be at an appropriate value between that of the positive power supply 9 and that of the negative power supply 2, which results in the deterioration of the dynamic range.

For this reason, the differential amplifier of FIG. 3 is equipped with elements for common mode feedback in practical applications, as shown in FIGS. 4(A) and (B). In a differential amplifier of FIG. 4(A), a common mode feedback device 12 is connected between the output terminals 5 and 6, the constant current source 1 of FIG. 3 is replaced by a variable current source 1a, and a voltage source 11 for providing the bias voltage is connected between the positive power supply 9 and the terminal 11 while the rest remains identical to that of FIG. 3. The common mode feedback device 12 measures the common mode component between the output terminals 5 and 6, and control the variable current source 1a so as to make the common mode component equal to an appropriately predetermined value. As a result, the direct current voltage between the output terminals 5 and 6 in this differential amplifier is almost independent of the common mode voltage at the input terminals 3 and 4, although the increase in size of the differential amplifier due to the inclusion of the common mode feedback device 12 has to be tolerated.

If this differential amplifier is to be utilized in an active filter, however, it is necessary to have a variable transconductance and the variable current source 1a has to be used for this purpose, which prevents it from being used for the common mode feedback simultaneously. In such a case, a differential amplifier of FIG. 4(B) can be used. In this differential amplifier, the common mode feedback device 12 controls the bias voltage of the transistor $Q_5$ and $Q_6$ through the terminal 11 so as to suppress the gain for the common mode components instead of the variable current source 1a. However, since the transistors $Q_5$ and $Q_6$ are to have large amplification while being pnp-type at the same time, their frequency characteristics are poor and in order to perform the common mode feedback consistently it is necessary to incorporate phase compensation capacitors 13 and 14 having large capacitances, between collectors and bases of the transistors $Q_5$ and $Q_6$. However these capacitors 13 and 14 effectively behave as loading elements so that the frequency characteristic is further deteriorated which makes it very difficult to utilize this differential amplifier in a device such as an integrator which already possesses capacitors.

As a solution to this awkward situation, a differential amplifier shown in FIG. 5 has been proposed. In this differential amplifier, a negative resistance 15 with a magnitude equal to that of the load resistors 7 and 8 combined is connected between the output terminals 5 and 6 while the rest remains identical to that of FIG. 1. As a result, the use of a pnp-type transistor is avoided so that a good frequency characteristic can be maintained, which in turn gives a wide frequency range. The negative resistance 15 functions to increase the loading resistance for the transistors $Q_1$ and $Q_2$ only with respect to the differential component so that a large amplification is obtained for the differential component while keeping a high common mode rejection ratio.

This can be seen more clearly from FIG. 6 where equivalent circuits for the differential component and the common mode component are shown.

FIG. 6(A) shows the equivalent circuit for the differential component, the so-called differential half circuit, where the negative resistance 15a a resistance —R which is equal to that of the load resistor 7 but of opposite sign. Since the negative resistance 15a and the load resistor 7 are in parallel, together they appear as an infinite load for the transistor $Q_1$ and this circuit effectively is equivalent to the aforementioned differential amplifier with a constant current load shown in FIG. 3, so that a large amplification can be obtained. The magnitude of the negative resistance 15a is ideally exactly equal to R but in any case it has to be less than R because otherwise the total resistance becomes negative and gives rise to the instability of the differential amplifier.

FIG. 6(B) on the other hand, shows the equivalent circuit for the common mode component, the so-called common mode half circuit, where the constant current source 1 in FIG. 5 gives rise to the resistance 16 having the magnitude twice as large as that of the internal resistance Ree of the constant current source 1, while the negative resistance 15 in FIG. 5 does not affect this circuit because it is connected between the points which are always maintained at the same level by the common mode component. The magnitude 2Ree of the resistance 16 is much larger than the magnitude of the usual load resistor 7 and takes the order of 10 K Ω to 1M Ω approximately. Since the load resistor 7 and the resistance 16 are in series in this circuit, the amount of voltage generated by the load resistor 7 is relatively small, and consequently the small amplification results for the common mode component. Thus, the differential amplifier of FIG. 5 is capable of achieving a large amplification, a wide frequency range, and a high common mode rejection ratio all at once.

One possible configuration of such a differential amplifier is shown in FIGS. 7, 8 and 9. In this differential amplifier, the negative resistance 15 of FIG. 5 comprises a positively feedbacked differential amplifier 17 as shown in FIG. 7 where it is connected between the first terminals 22 and 23 and accompanied by a terminal resistor 18 which is connected between second terminals 19 and 21, while the rest remains identical to that of FIG. 5.

A detailed configuration of the positively feedbacked differential amplifier 17 is shown in FIG. 8. It is comprised of a pair of npn-type transistors $Q_7$ and $Q_8$ whose emitters are connected with each other through a terminal resistor 18 having a resistance 2R and being located between the second terminals 19 and 21, and each collector of $Q_7$ is connected with the base of the other as well as to the first terminals 22 and 23. Also current sources 24, 25, 26 and 27 producing currents $I_1$ are provided to each of the emitters and the collectors of the transistors $Q_7$ and $Q_8$ from positive and negative power supply 9 and 2, respectively. In this positively feedbacked differential amplifier 17, a positive feedback circuit is formed by connecting each base of the emitter-degenerated transistors $Q_7$ and $Q_8$ to the collector of the partner transistor, so that when there is large enough transconductance before the positive feedbacks take place, the resistance appearing between the first terminals 22 and 23 is going to be $-1$ times the resistance of the terminal resistor. Although this positively feedbacked differential amplifier is unstable by itself, by connecting the first terminals 22 and 23 to a circuit having a positive resistance so large as to make a net resistance positive, stable operations can be secured.

The positively feedbacked differential amplifier of FIG. 8 incorporated into the differential amplifier of FIG. 7 as a negative resistance is shown in FIG. 9 where the currents produced by constant current source 1 is denoted as $I_Q$ to distinguish from the currents $I_1$ produced by the other current sources 24, 25, 26 and 27. The current sources 26 and 27 were superfluous here as they were meant to provide bias currents to the positively feedbacked differential amplifier 17 in FIG. 8, but in FIG. 9 are redundant with load resistors 7 and 8.

As explained above, this differential amplifier shown in FIG. 9 is capable of achieving a large amplification, a wide frequency range, and a high common mode rejection ratio simultaneously.

However, it has a drawback that its output voltages are limited up to approximately 0.6 V due to saturations of the transistors $Q_7$ and $Q_8$ in the positively feedbacked differential amplifier 17 occurring as the output voltage increases. In other words, its dynamic range is rather narrowly limited. This may not be as serious a problem when this differential amplifier is utilized as a first stage of some amplifier where the output voltages do not need to reach to that level.

Nevertheless, since this differential amplifier possesses large input and output impedances, it can potentially be utilized as a transconductance, such as for example, with an integrator and a capacitor as a load to be used as an active filter. And in such an application, it is desirable for the differential amplifier to have a wide dynamic range.

SUMMARY OF THE INVENTION

It is therefore an object of the present invention to provide a differential amplifier which possesses a wider frequency range, a greater amplification, a better common mode rejection ratio, and a wide dynamic range, simultaneously.

This object is achieved in the present invention by providing a differential amplifier, comprising: input terminals; output terminals; load resistor means connected to the output terminals for generating output voltage; negative resistance means for producing negative resistance including level shift circuit means for producing additional voltages, the negative resistance means being connected to an output terminal; a pair of transistors, their emitters being connected with each other, their collectors being connected to the output terminals, and their bases being coupled to the input terminals; and current source means connected to the emitters of the transistors for providing the emitter currents.

Other features and advantages of the present invention will become apparent from the following description taken in conjunction with the accompanying drawings.

BRIEF DESCRIPTION OF THE DRAWINGS

FIG. 10 is a circuit diagram of the first embodiment of a differential amplifier according to the present invention.

FIGS. 11(A), 11(B), 11(C), 11(D) and 11(E) are diagrams of possible circuit elements to be incorporated in the differential amplifier of FIG. 10.

DETAILED DESCRIPTION OF THE PREFERRED EMBODIMENTS

The various preferred embodiments of the present invention will now be explained. In the following description, as certain portions of the embodiments of the present invention overlap with those already explained in the description of the prior art, such portions are given the same symbols in the figures and their explanation will not be repeated.

Figure 9:
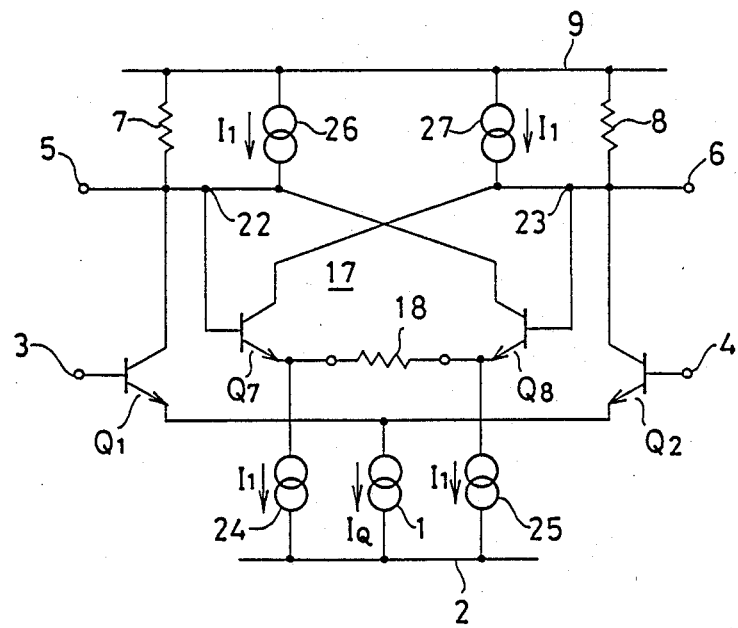

Referring now to FIG. 10, there is shown the first embodiment of a differential amplifier according to the present invention. This differential amplifier incorporates, in addition to the differential amplifier of FIG. 9, two level shift circuits 28 and 29, the level shift circuit 28 being connected between the base of the transistor $Q_7$ and the collector of the transistor $Q_8$, and the level shift circuit 29 being connected between the base of the transistor $Q_8$ and the collector of the transistor $Q_7$. Also in FIG. 10, the superfluous current sources 26 and 27 of FIG. 9 are removed, and unless the level shift circuits 28 and 29 possess exceedingly large internal resistances the sections crossed can be disconnected when the sections shown by the dotted lines are connected without any significant effect. These level shift circuits 28 and 29 raise the collector voltages of the transistors $Q_7$ and $Q_8$ with respect to their base voltages, so that the output voltages increase by the amount that the level shift circuits 28 and 29 raise the collector voltages, and the dynamic range is widened accordingly.

The level shift circuits 28 and 29 can be of various different types such as those shown in FIG. 11, in which FIG. 11(A) shows a battery, FIG. 11(B) shows a series of n diodes where n is a positive integer, FIG. 11(C) shows a series of n transistors with their bases connected to their collectors, FIG. 11(D) shows a transistor with its base-emitter voltage amplified, and FIG. 11(E) shows a resistor.

Figure 12:
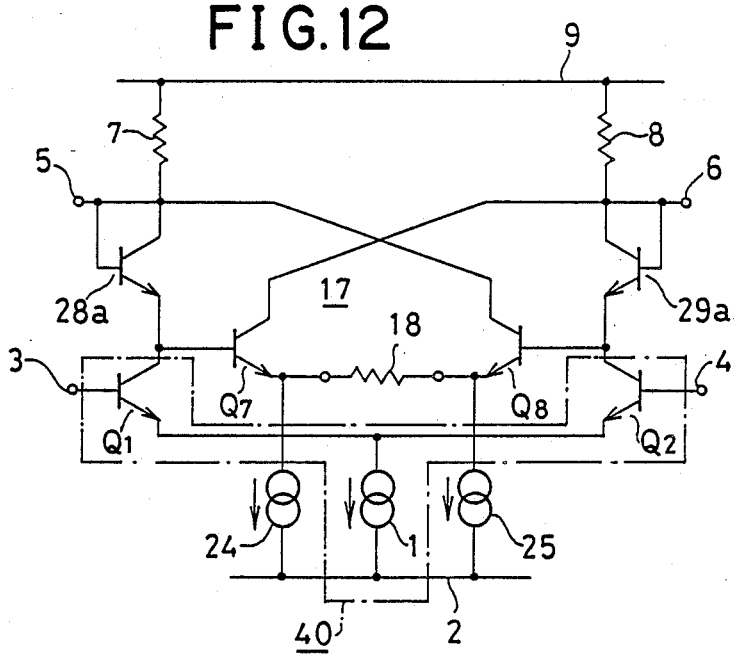
FIG. 12 is a circuit diagram of the second embodiment of a differential amplifier according to the present invention.
Figure 13:
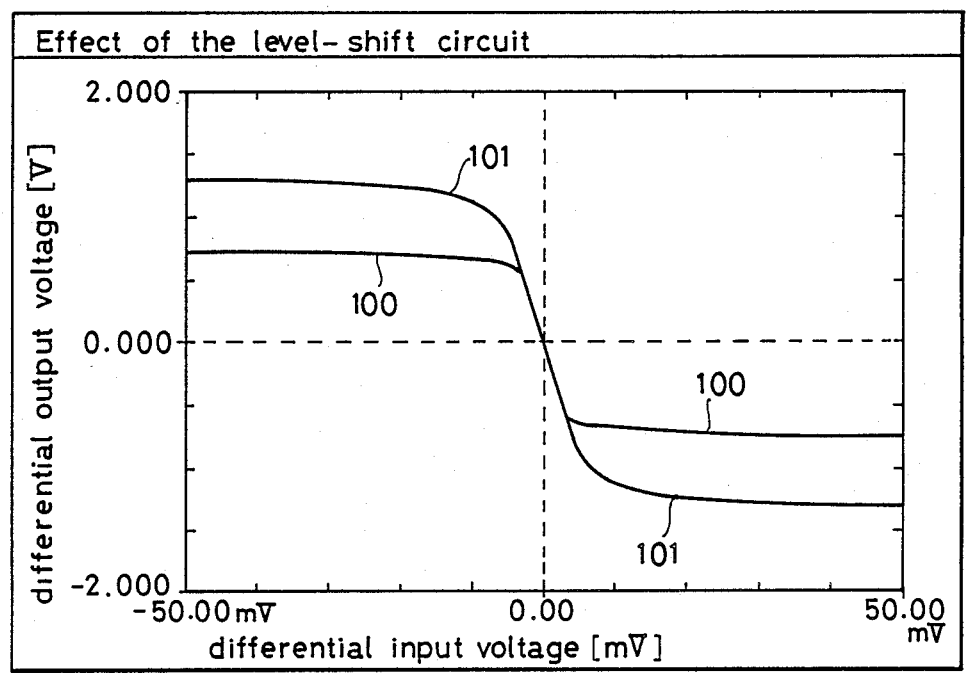
FIG. 13 is a graph showing the improvement of the dynamic range by the differential amplifier of FIG. 12.

Referring now to FIG. 12, there is shown the second embodiment of a differential amplifier according to the present invention. In this embodiment the level shift circuits 28 and 29 of FIG. 10 are chosen to be the transistors as shown in FIG. 11(C) with n equal to one. This differential amplifier can generate output voltages of approximately 1.2 V, so its dynamic range is twice as wide as the prior art amplifier of FIG. 9. This can be seen from the graph of FIG. 13 which shows the input-output characteristics of the differential amplifier of FIG. 12 and the prior art differential amplifier of FIG. 9. In FIG. 13, the horizontal axis represents the differential input voltage between the input terminals 3 and 4, the vertical axis represents the differential output voltage between the output terminals 5 and 6, a curve 100 indicates the input-output characteristic of the differential amplifier of FIG. 9 which has no level shift circuit, and a curve 101 indicates the input-output characteristic of the differential amplifier of FIG. 12 which includes the level shift circuits 28 and 29.

Moreover, due to the effect of the negative resistance produced by the positively feedbacked differential amplifier 17, the output impedance of this differential amplifier can be quite large, although in practice contributions from the transistors of the positively feedbacked differential amplifier 17 lessen it to some extent. It is to be noted, however, that because of the variations in output resistance of the manufactured transistors, an attempt to make the magnitudes of the negative resistance by the positively feedbacked differential amplifier 17 and the net resistance of the load resistors 7 and 8 exactly equal in practices is not recommended due to instability as discussed in the description of the prior art. Meanwhile, because the transistors $Q_1$ and $Q_2$ are in common-emitter configuration, the input impedance of this differential amplifier is large, and thus it is suitable for applications as a transconductance.

Figure 1:
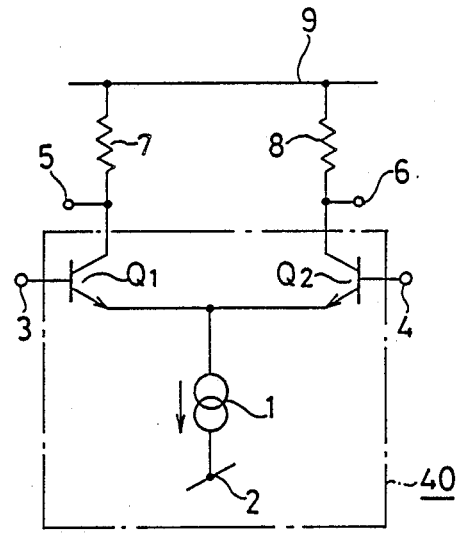
FIG. 1 is a circuit diagram of a differential amplifier according to the first prior art.
Figure 2:
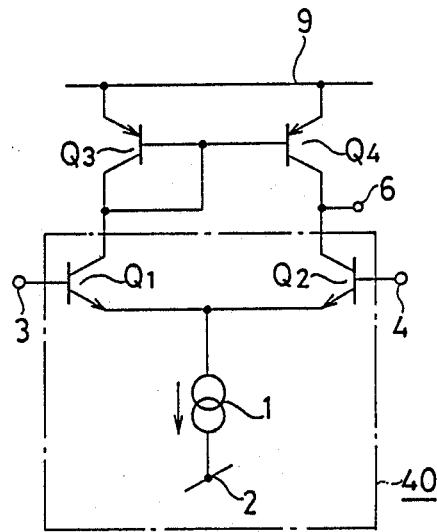
FIG. 2 is a circuit diagram of a differential amplifier according to the second prior art.
Figure 3:
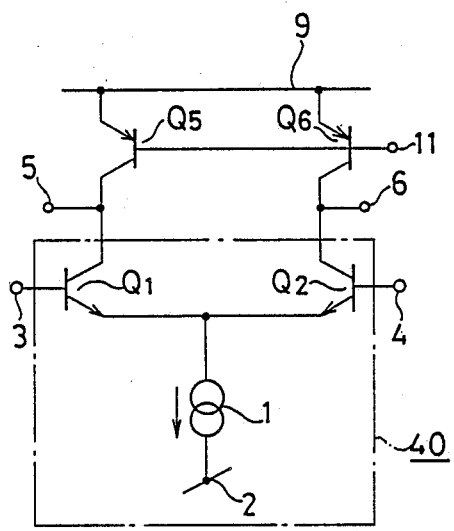
FIGS. 3, 4(A) and 4(B) are circuit diagrams of differential amplifiers according to the third prior art.
Figure 4A:
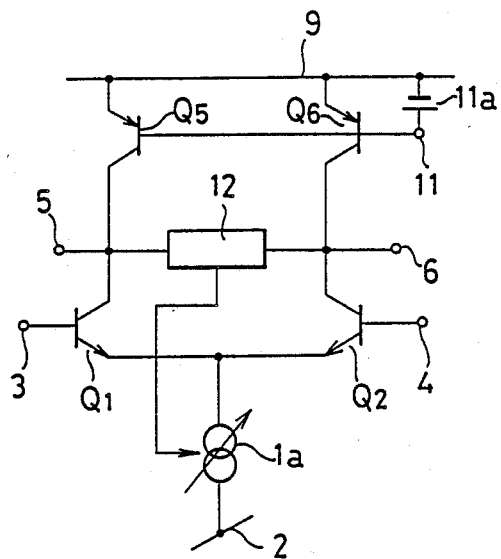
Figure 4B:
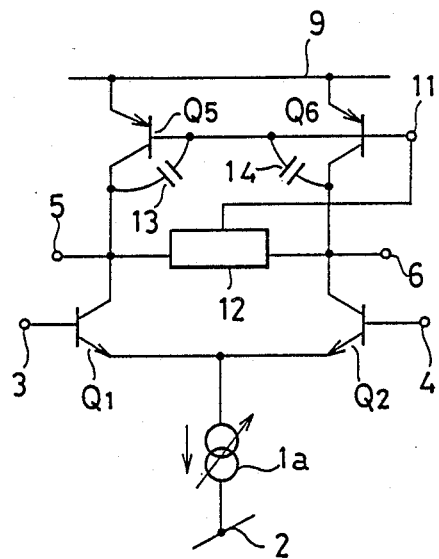
Figure 5:
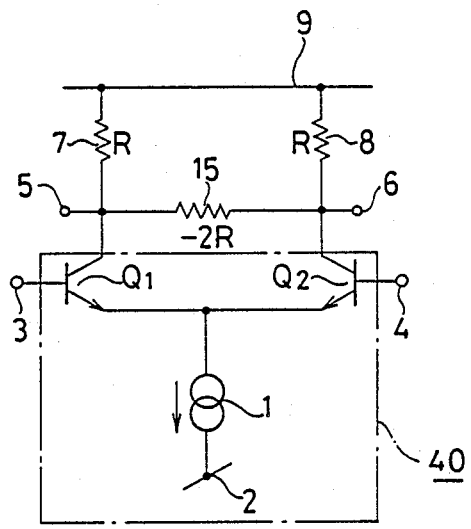
FIG. 5, is a circuit diagram of a differential amplifier according to the fourth prior art.
Figure 6A:
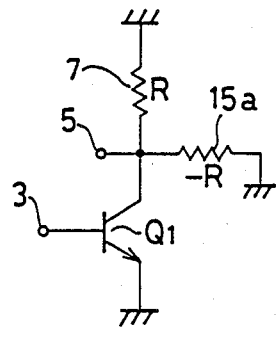
FIGS. 6(A) and 6(B) are equivalent circuit diagrams for differential and common mode components, respectively, of the differential amplifier of FIG. 5.
Figure 6B:
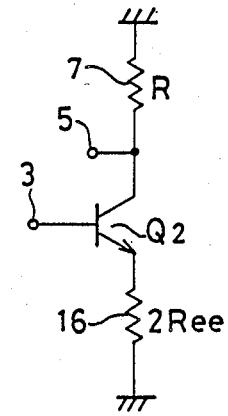
Figure 7:
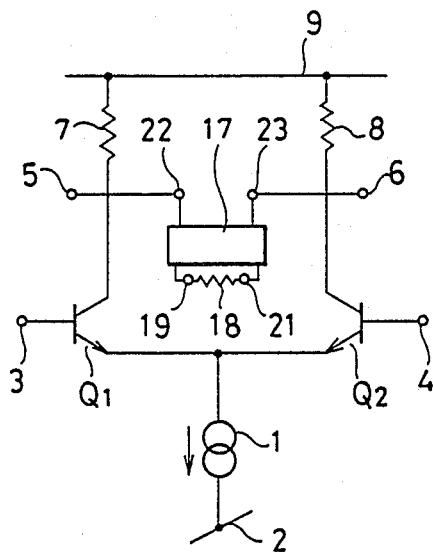
FIGS. 7, 8 and 9 are circuit diagrams for explaining one embodiment of a differential amplifier according to the fourth prior art.
Figure 8:
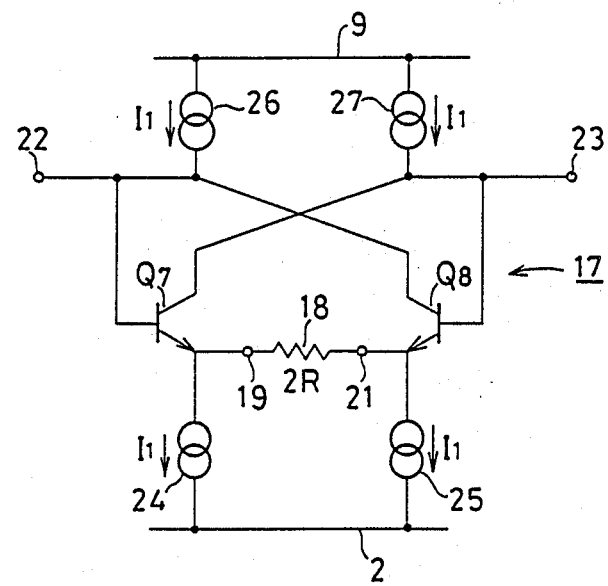
Figure 14:
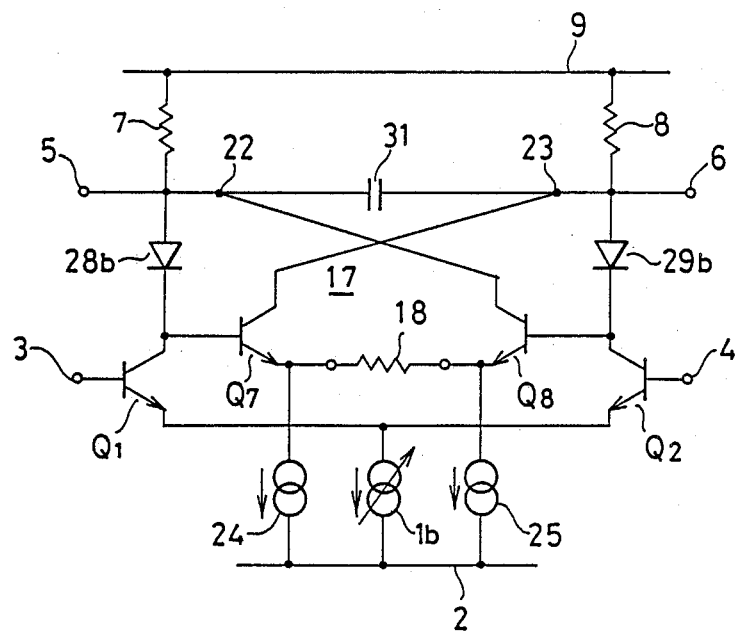
FIG. 14 is a circuit diagram of the third embodiment of a differential amplifier according to the present invention.

Referring now to FIG. 14, there is shown the third embodiment of a differential amplifier according to the present invention. In this embodiment the level shift circuits 28 and 29 of FIG. 10 are the diodes as shown in FIG. 11(B) with n equal to one, the constant current source 1 of FIG. 10 is replaced by a variable current source 1b which can generate currents up to $2I_Q$ and a capacitor 31 of capacitance C connected between the first terminals 22 and 23 is incorporated as a load which makes the entire circuit function as an integrator. For this differential amplifier, the transconductance from the input terminals 3 and 4 to the output terminals 5 and 6 is given by:

$$gm = I_Q/Vt \qquad (1)$$

where $Vt = kT/q$, k is the Boltzmann constant, T is the absolute ambient temperature, and q is the charge of an electron, so that the output voltage $V_{out}$ in terms of the input voltage $V_{in}$ is given by:

$$V_{out} = gm \cdot V_{in}/sC \qquad (2)$$
$$= \frac{1}{sC} \cdot \frac{I_Q}{Vt} \cdot V_{in}$$

where s is a variable of the Laplace transform. This result can be considered as an integration of $V_{in}$. Now, since the time constant of this integrator is equal to $C(Vt/I_Q)$, by variation of the currents from the variable current source 1b it can function as an integrator with a variable time constant particularly suitable for an integrated active filter. Furthermore, in this embodiment, the capacitance of the integrating capacitor 31 can be reduced compared with the prior art, such as the one shown in FIG. 4(B), where two capacitors 13 and 14 have to be placed in series, which reduces the net capacitance to half so that these capacitors have to have capacitance twice as large as necessary for the capacitor 31 of this embodiment in order to obtain the same time constant. This aspect of the present embodiment can contribute to the reduction of the device size.

Figure 15:
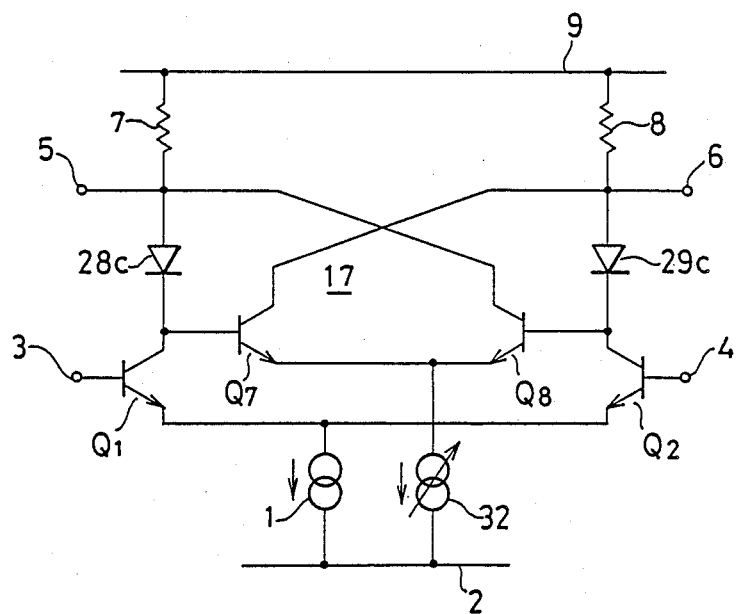
FIG. 15 is a circuit diagram of the fourth embodiment of a differential amplifier according to the present invention.

Referring now to FIG. 15, there is shown the fourth embodiment of a differential amplifier according to the present invention. In this embodiment the level shift circuits are diodes as in the previous embodiment, but the terminal resistance 18 and the capacitor 31 are removed and the current sources 24 and 25 are replaced by a variable current source 32 connected to the emitters of the transistors $Q_7$ and $Q_8$ while the variable current source 1b is replaced by the constant current source 1 connected to the emitters of the transistors $Q_1$ and $Q_2$. For this differential amplifier, the input impedance of the positively feedbacked differential amplifier 17 seen from the output terminals 5 and 6 is determined solely by the transconductances of the transistors $Q_7$ and $Q_8$ of the positively feedbacked differential amplifier 17. Namely, when the variable current source 32 produces current I, the transconductance of each of the transistors $Q_7$ and $Q_8$ is equal to I/2Vt, and the input impedance r which is the same as a negative of a sum of the inverses of the transconductances is given by:

$$r = -\frac{4Vt}{I}$$

which is inversely proportional to the current I from the variable current source 32. Thus the load for the transistors $Q_1$ and $Q_2$ is given by:

$$\frac{R \cdot r}{(R + r)}$$

so that by varying the currents I the differential amplifier of variable amplification in the range $|r| < R$ can be obtained in this embodiment.

Figure 16:
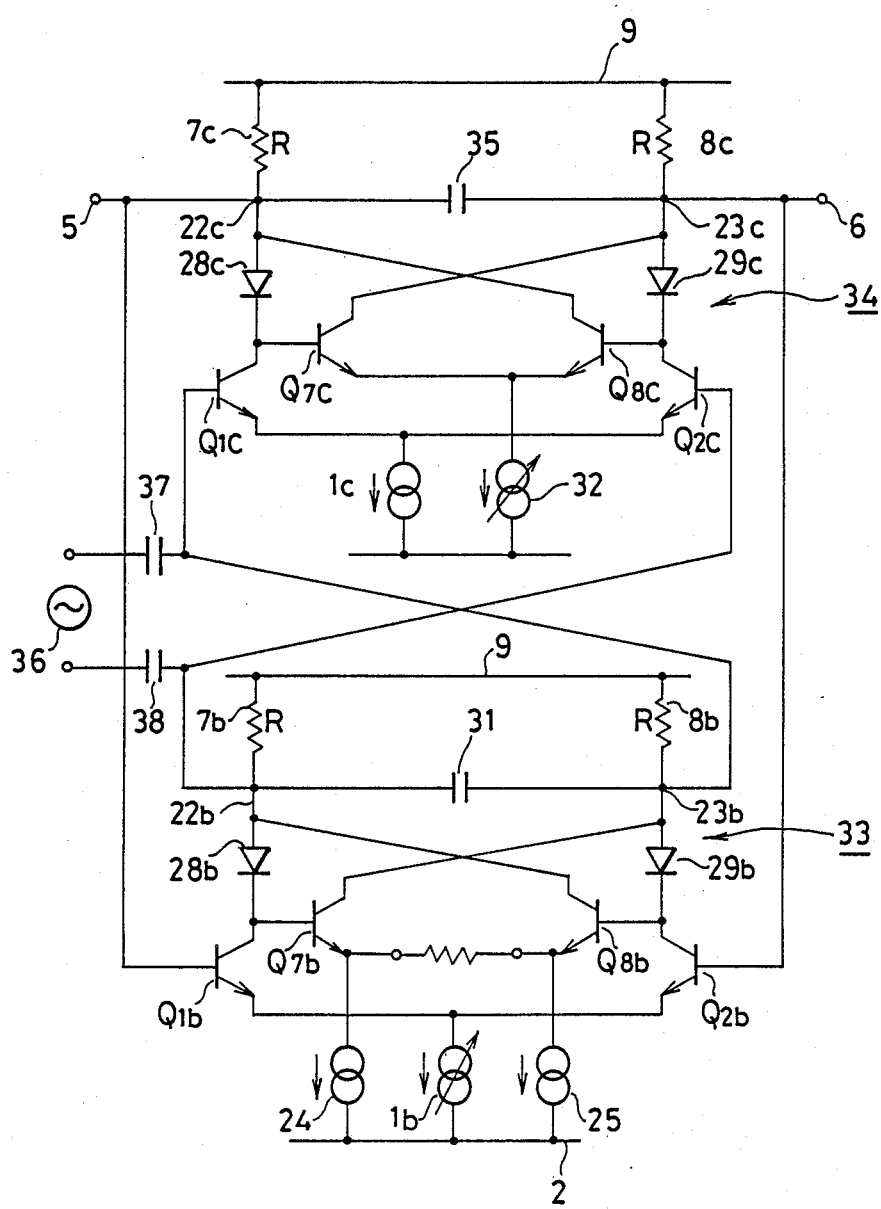
FIG. 16 is a circuit diagram of the fifth embodiment of a differential amplifier according to the present invention.

Referring now to FIG. 16, there is shown the fifth embodiment of a differential amplifier according to the present invention. In this embodiment, a first integrator 33 identical to that of FIG. 14 is combined with a second integrator 34 made by the amplifier of FIG. 15 equipped with a load capacitor 35 such that the bases of the transistors $Q_{1b}$, $Q_{2b}$, $Q_{1c}$, $Q_{2c}$ are connected to the terminals 22c, 23c, 23b, 22b, respectively, while an input generator 36 is connected through capacitors 37 and 38 to the terminals 23b and 22b, respectively, to form a band-pass filter. This band-pass filter is particularly suitable for application to the adaptive filter because its quality factor Q can be varied by varying currents I from the variable current source 32.

Figure 17:
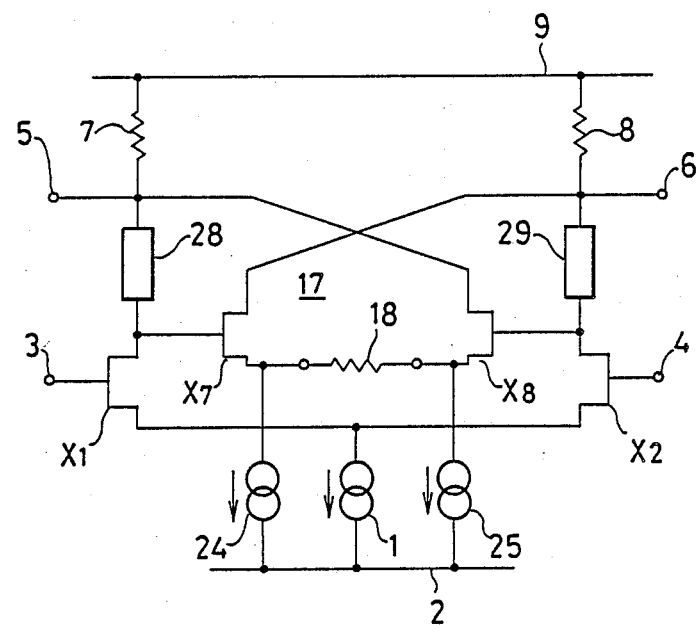
FIG. 17 is a circuit diagram of the sixth embodiment of a differential amplifier according to the present invention.

Referring now to FIG. 17, there is shown the sixth embodiment of a differential amplifier according to the present invention. In this embodiment the transistors $Q_1$, $Q_2$, $Q_7$, $Q_8$ of FIG. 10 are replaced by GaAs MESFETs (Metal Semiconductor Field Effect Transistors) $X_1$, $X_2$, $X_7$, $X_8$. Currently, GaAs MESFETs in practice are predominantly n-channel type because p-channel type are considerably slower in response. Since this differential amplifier of the present embodiment can be constructed only by n-channel type GaAs MESFETs, it can contribute to flexibility in circuit designing and reduction in device size. It is to be noted that the similar situation exists for the GaAs heterojunction bipolar transistor whose pnp-type is considerably slower in response compared with npn-type and is also very hard to manufacture.

Figure 18:
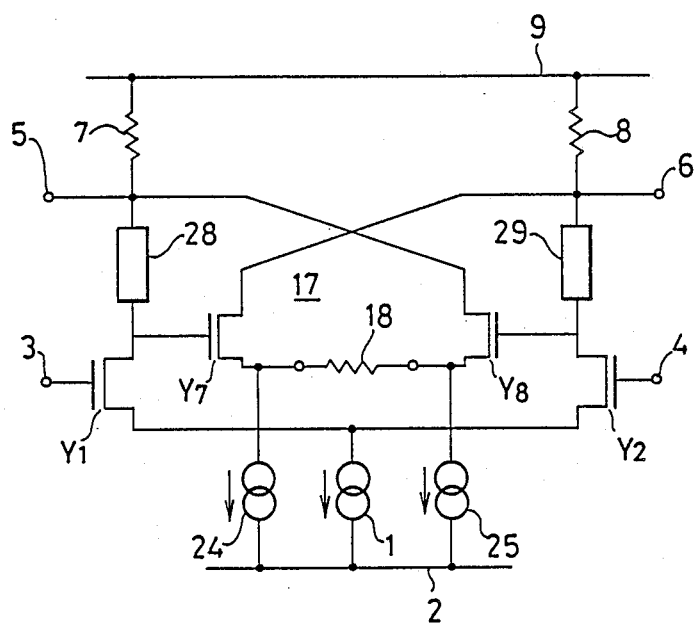
FIG. 18 is a circuit diagram of the seventh embodiment of a differential amplifier according to the present invention.

Referring now to FIG. 18, there is shown the seventh embodiment of a differential amplifier according to the present invention. In this embodiment, GaAs MESFETs $X_1$, $X_2$, $X_7$, $X_8$ of the previous embodiment are replaced by Si MOSFETs (Metal Oxide Semiconductor Field Effect Transistors) $Y_1$, $Y_2$, $Y_7$, $Y_8$. Here again, p-channel type are considerably slower in response compared with n-channel type. Although in this case of Si MOSFETs, p-channel type is also available and can be incorporated, this differential amplifier of the present embodiment which can be constructed only of n-channel type Si MOSFETs obviously can be faster in response and thus be considered superior than any amplifier involving p-channel type Si MOSFETs.

Figure 19:
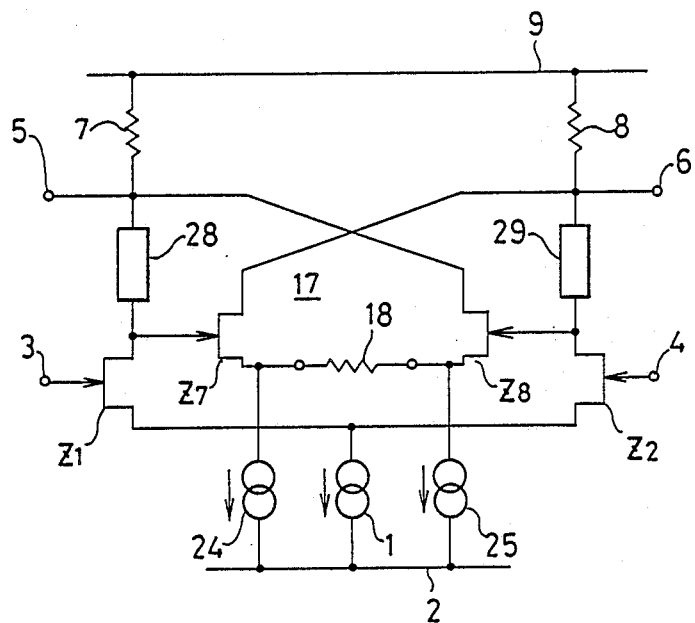
FIG. 19 is a circuit diagram of the eighth embodiment of a differential amplifier according to the present invention.

Referring now to FIG. 19, there is shown the eighth embodiment of a differential amplifier according to the present invention. In this embodiment, Si MOSFETs $Y_1$, $Y_2$, $Y_7$, $Y_8$ of the previous embodiment are replaced by JFETs (Junction Field Effect Transistors) $Z_1$, $Z_2$, $Z_7$, $Z_8$. Here again, p-channel type is considerably slower in response compared with n-channel type. Although in this case of JFETs as in the case of MOSFETs, p-channel type is also available and can be incorporated, this differential amplifier of the present embodiment which can be constructed only of n-channel type JFETs obviously can be faster in response and thus be considered superior to any amplifier involving p-channel type JFETs.

Figures 20A, 20B:
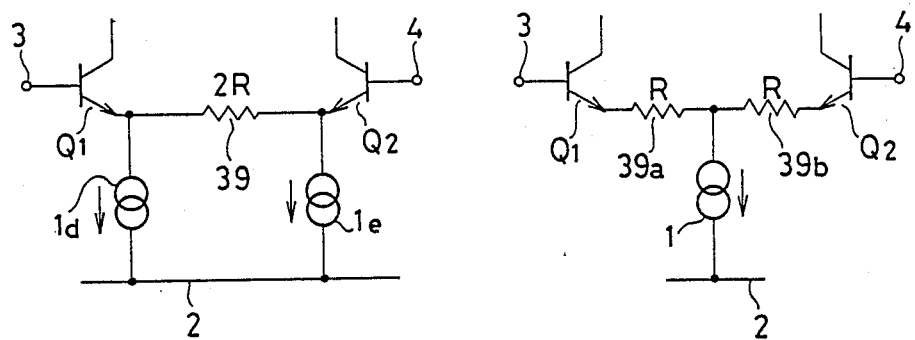
FIGS. 20(A) and 20(B) are partial circuit diagrams of possible variations of the differential amplifier according to the present invention.

It can be easily understood that although the transistors $Q_1$ and $Q_2$ in the above embodiments formed an emitter-coupled pair in which their emitters are connected with each other directly, this configuration can be replaced by the so called emitter degeneration type such as those shown in FIGS. 20(A) and (B). Though with such a replacement the amplification lowered, the linearity can be improved by means of the emitter degeneration so that it is possible to enhance the dynamic range further in the differential amplifier of the present invention. Similarly, although the transistors $Q_7$ and $Q_8$ in the above embodiments had the configuration similar to that shown in FIG. 20(A), the configuration can be replaced by the configuration similar to that shown in FIG. 20(B) with the same effect.

Figure 21:
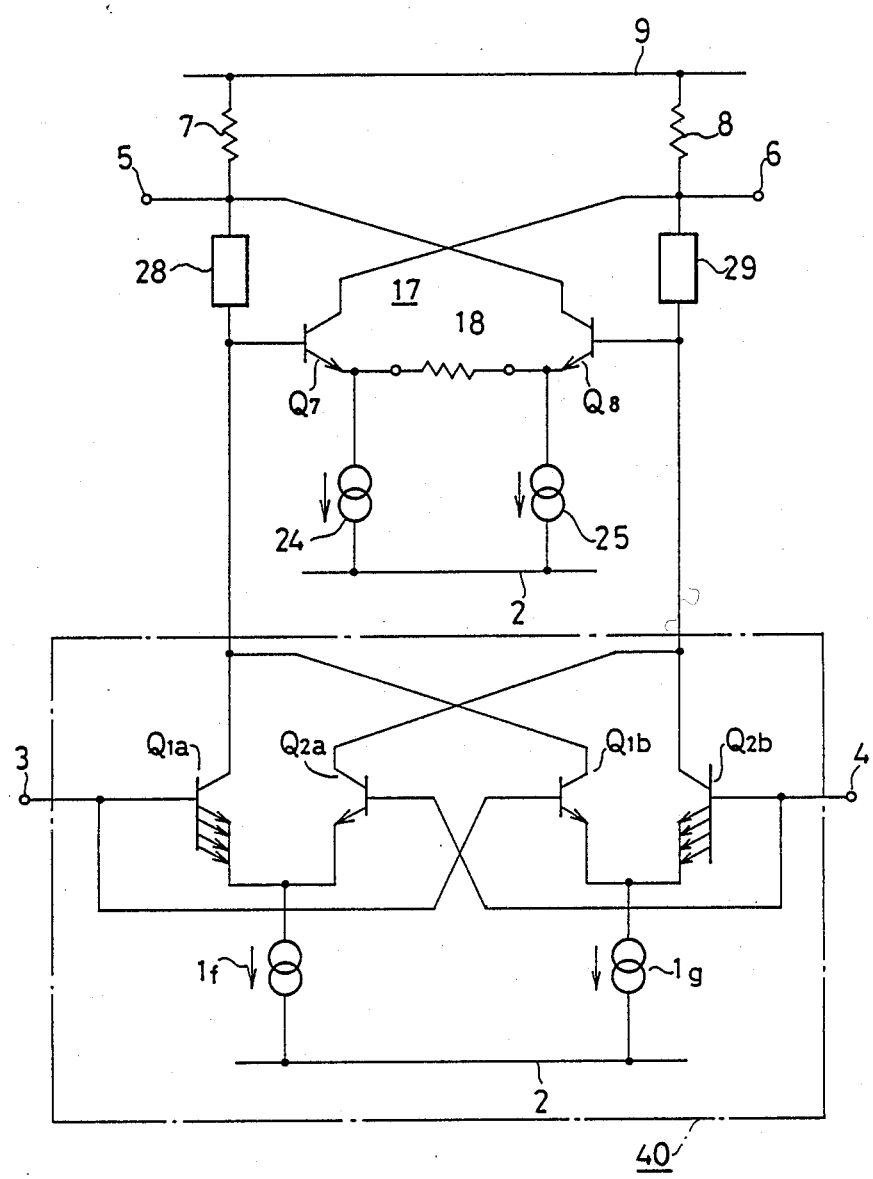
FIG. 21 is a circuit diagram of one application of a differential amplifier according to the present invention.
Figure 22:
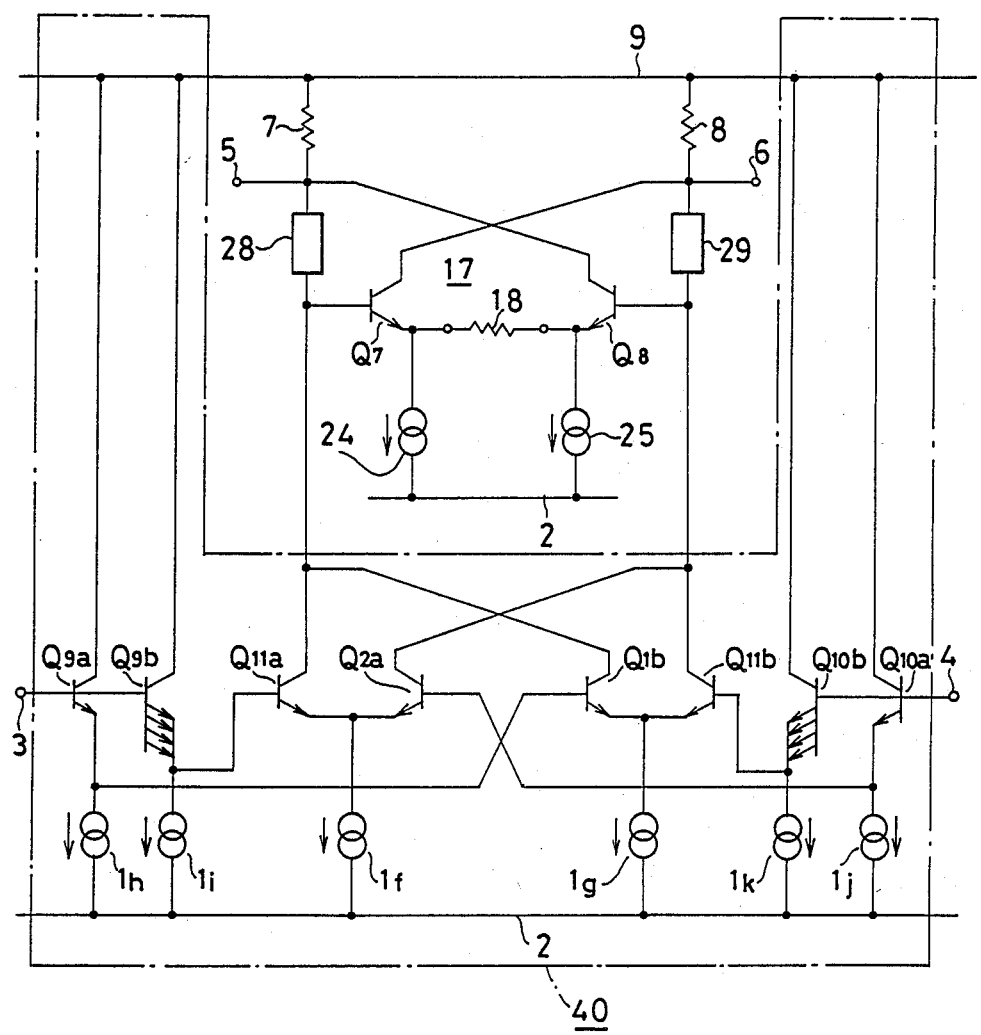
FIG. 22 is a circuit diagram of another application of a differential amplifier according to the present invention.

Similar improvement of the linearity as achieved by incorporating emitter degeneration in the differential amplifier of the present invention above can be realized by the configurations shown in FIGS. 21 and 22.

In FIG. 21, the differential amplification portion 40 of the differential amplifier of FIG. 10 is replaced by the linear differential amplifier proposed by J. C. Schmoock in "An Input Stage Transconductance Reduction Technique for High-Slew Rate Operational Amplifiers" IEEE Journal of Solid State Circuits, vol. SC-10, no. 6, pp. 407-411, Dec. 1975. In this differential amplifier, the transistors $Q_{1a}$ and $Q_{2b}$ have emitter areas four times as large as that of the transistors $Q_{1b}$ and $Q_{2a}$, and the constant current sources $1_f$ and $1_g$ provides the same amount of emitter current to these transistors so that improvement of the linearity can be achieved without emitter degeneration.

In FIG. 22, the differential amplification portion 40 of the differential amplifier of FIG. 21 is modified so that the differential amplifier can operate faster. Namely, in this differential amplifier the transistors $Q_{11a}$, $Q_{2a}$, $Q_{1b}$, and $Q_{11b}$ have the same emitter areas, but they are accompanied by the emitter followers formed by the transistors $Q_{9a}$, $Q_{9b}$, $Q_{10a}$, and $Q_{10b}$, and their emitter current sources 1h, 1i, 1k, and 1j, where the transistors $Q_{9b}$ and $Q_{10b}$ have the emitter areas four times as large as that of the transistors $Q_{11a}$, $Q_{2a}$, $Q_{1b}$, and $Q_{11b}$ while the transistors $Q_{9a}$ and $Q_{10a}$ have the same emitter areas as the transistors $Q_{11a}$, $Q_{2a}$, $Q_{1b}$, and $Q_{11b}$ so as to improve the linearity. Compared with the differential amplifier of FIG. 21, this differential amplifier of FIG. 22 can operate at the higher frequency range because the emitter areas of the transistors $Q_{11a}$, $Q_{2a}$, $Q_{1b}$, and $Q_{11b}$ can be made smaller. Also, this differential amplifier of FIG. 22 possesses a larger input impedance due to the inclusion of the emitter followers.

It can also easily be understood that, if only pnp-type transistors or p-channel type MOSFETs are required to be present in the device, an acceptable amplifier can easily be obtained by reversing the direction of the currents although obviously such a circuit is going to be very slow in response and will possess an inferior frequency characteristic.

Moreover, many modifications and variations of these embodiments may be made without departing from the novel and advantageous features of the present invention. Accordingly, all such modifications and variations are intended to be included within the scope of the appended claims.

What is claimed is:

1. A differential amplifier, comprising:
  first input terminals;
  first output terminals;
  first load resistor means connected to the first output terminals for generating output voltages;
  first negative resistance means for producing negative such that a resistance value in a numerator of a fraction expressing the gain of the differential amplifier is maximized, the first negative resistance means including first level shaft circuit means for producing additional voltages, the first negative resistance means being connected to the first output terminals;
  a first pair of transistors having emitters connected to each other, collectors connected to the first output terminals, and bases coupled to the first input terminals; and
  first current source means connected to the emitters of the first pair of transistors for providing emitter currents to the first pair of transistors.

2. The amplifier of claim 1, wherein the first negative resistance means includes:
  a second pair of transistors having emitters connected to each other and collectors connected to the base of the other transistor of the second pair of transistors as well as to the first output terminals; and
  second current source means connected to the emitters of the second pair transistors for providing emitter currents to the second pair of transistors;
  a terminal resistor connected between emitters of the second pair of transistors; and wherein
  the first level shift circuit means is connected between the base of each transistor of the second pair of transistors and the first output terminals.

3. The amplifier of claim 1, wherein the first level shift circuit means comprises a battery.

4. The amplifier of claim 1, wherein the first level shift circuit means comprises at least one diode.

5. The amplifier of claim 1, wherein the first level shift circuit means comprises at least one transistor with its base connected to its own collector.

6. The amplifier of claim 1, wherein the first level shift circuit means comprises a transistor with its base-emitter voltage amplified.

7. The amplifier of claim 1, wherein the first level shift circuit means comprises a resistor.

8. The amplifier of claim 2, further comprising first capacitor means connected to the first output terminals for accumulating charges, and wherein the first current source means is a variable current source.

9. The amplifier of claim 2, wherein the second current source means is a variable current source, and wherein the resistance of the terminal resistor is small.

10. The amplifier of claim 8, further comprising:
  a second differential amplifier, comprising:
  second input terminals;
  second output terminals;
  second load resistor means connected to the second output terminals for generating output voltages;
  second negative resistance means for producing negative resistance connected to the second output terminals and including:
  a third pair of transistors having emitters connected to each other, collectors connected to the base of the other transistor of the third pair of transistors as well as to the second output terminals;
  second variable current source means connected to the emitters of the third pair of transistors for providing emitter currents to the third pair of transistors;
  second level shift means, connected between the base of each transistor of the third pair of transistors and the second output terminals, for producing additional voltages; and second capacitor means connected to the second output terminals for accumulating charges;

a fourth pair of transistors having emitters connected to each other, collectors connected to the second output terminals, and bases coupled to the second input terminals;

constant current source means connected to the emitters of the fourth pair of transistors for providing emitter currents to the fourth pair of transistors, wherein the first output terminals are connected to the second input terminals, and the first input terminals are connected to the second output terminals in a direction reverse to the connection between the first output terminals and the second input terminals;

third output terminals connected to the first input terminals; and third input terminals connected to the first output terminals;

wherein the transistors are Metal Semiconductor Field Effect Transistors.

11. The amplifier of claim 1, wherein the transistors are heterojunction bipolar transistors.

12. The amplifier of claim 1, wherein the transistors are MESFETs.

13. The amplifier of claim 1, wherein the transistors are Metal Oxide Semiconductor Field Effect Transistors.

14. The amplifier of claim 1, wherein the transistors are Junction Field Effect Transistors.

15. The amplifier of claim 2, wherein the transistors of the second pair of transistors are heterojunction bipolar transistors.

16. The amplifier of claim 1, wherein the transistors of the second pair of transistors are Metal Semiconductor Field Effect Transistors.

17. The amplifier of claim 2, wherein the transistors of the second pair of transistors are Metal Oxide Semiconductor Field Effect Transistors.

18. The amplifier of claim 2, wherein the transistors of the second pair of transistors are Junction Field Effect Transistors.

19. The amplifier of claim 1, further comprising an emitter degeneration resistor between the emitters of the first pair of transistors.

20. The amplifier of claim 2, wherein the first level shift circuit means comprises a battery.

21. The amplifier of claim 2, wherein the first level shift circuit means comprises at least one diode.

22. The amplifier of claim 2, wherein the first level shift circuit means comprises at least one transistor with its base connected to its own collector.

23. The amplifier of claim 2, wherein the first level shift circuit means comprises a transistor with its base-emitter voltage amplified.

24. The amplifier of claim 2, wherein the first level shift circuit means comprises a resistor.

25. The amplifier of claim 2, further comprising an emitter degeneration resistor between emitters of the first pair of transistors.

26. A differential amplifier, comprising:
first input terminals;
first output terminals;
first load resistor means connected to the first output terminals for generating output voltages;
first negative resistance means for producing negative resistance such that a resistance value in a numerator of a fraction expressing the gain of the differential amplifier is maximized, the first negative resistance means including first level shift circuit means for producing additional voltages, the first negative resistance means being connected to the first output terminals;
a first pair of transistors having source terminals connected to each other, drain terminals connected to the first output terminals, and gate terminals coupled to the first input terminals; and
first current source means connected to the source terminals of the first pair of transistors for providing currents to the first pair of transistors.

27. The amplifier of claim 26, wherein the first negative resistance means includes:
a second pair of transistors having source terminals connected to each other and drain terminals connected to the gate terminal of the other transistor of the second pair of transistors as well as to the first output terminals; and
second current source means connected to the source terminals of the second pair of transistors for providing currents to the second pair of transistors;
a terminal resistor connected between source terminals of the second pair of transistors; and wherein
the first level shift circuit means is connected between the gate terminal of each transistor of the second pair of transistors and the first output terminals.

* * * * *